United States Patent [19]
Lakshmikumar

[11] Patent Number: 6,104,228
[45] Date of Patent: Aug. 15, 2000

[54] PHASE ALIGNER SYSTEM AND METHOD

[75] Inventor: Kadaba R. Lakshmikumar, Basking Ridge, N.J.

[73] Assignee: Lucent Technologies Inc., Murray Hill, N.J.

[21] Appl. No.: 08/997,084

[22] Filed: Dec. 23, 1997

[51] Int. Cl.⁷ .......................... H03K 17/62; H03H 11/26
[52] U.S. Cl. ............................................ 327/407; 327/284
[58] Field of Search ............................... 327/99, 144, 145, 327/147, 149, 150, 152, 153, 156, 158, 159, 161, 269–271, 276, 277, 284, 293, 298, 407

[56] References Cited

U.S. PATENT DOCUMENTS

| | | | |
|---|---|---|---|
| 4,618,787 | 10/1986 | Jacksier et al. | 327/262 |
| 5,374,860 | 12/1994 | Llewellyn | 327/276 |
| 5,530,387 | 6/1996 | Kim | 327/119 |
| 5,708,382 | 1/1998 | Park | 327/277 |
| 5,818,890 | 10/1998 | Ford et al. | 375/371 |

OTHER PUBLICATIONS

Jeff Sontag, Robert Leonowich, *A Monolithic CMOS 10 MHz DPLL for Burst–Mode Data Retiming*, 1990 IEEE International Solid State Circuit Conference, 2/16 v.33.

*Primary Examiner*—My-Trang Nuton

[57] ABSTRACT

A system for aligning the phase of signals generated by a selectable standby clock source which has a predetermined frequency with the phase of signals generated by a selected clock source which has the same frequency as signals generated by the standby clock source. The system comprises (1) a delay line having a plurality of delay elements which is configured to receive the signals generated by the standby clock source so that the output signal of each delay element is a delayed version of the standby clock source; (2) a decoder configured to receive each of the delayed versions of the signals generated by the standby clock signal source and generates a selection signal corresponding to a desired one of the delayed version signals that is aligned with signals generated by the selected clock source within a specifiable phase difference; and (3) a selector configured to receive the selection signal so as to select the desired delayed version signal as a new standby clock source.

18 Claims, 8 Drawing Sheets

FIG. 8A CLOCK 58
FIG. 8B CLOCK 56
FIG. 8C DELAY 1
FIG. 8D DELAY 2
FIG. 8E DELAY 3

| $Q_1$ | $Q_2$ | $Q_3$ | $Q_4$ | $Q_5$ | $Q_6$ | $Q_7$ | $Q_8$ | $Q_9$ | $Q_{10}$ | ... |
|---|---|---|---|---|---|---|---|---|---|---|
| 1 | 1 | 0 | 0 | 0 | 0 | 0 | 0 | 0 | 0 | ... |

FIG. 8F

PHASE ALIGNER SYSTEM AND METHOD

FIELD OF THE INVENTION

This invention relates to a phase aligner system and more specifically to a phase aligner system employed in situations where a system clock is switched from a first clock source to a second clock source.

BACKGROUND OF THE INVENTION

There are many situations wherein the clock source employed in an electrical system requires to be switched to another clock source. For example, during maintenance operations, it may become necessary to disconnect the module that contains a clock source from the rest of a system that employs the signals generated from that clock source. In order to prevent any interruption in the operation of the rest of the system, a standby clock source is employed so as to provide the necessary clock signals.

Typically, the frequency of the signals generated by the original clock source is the same as the frequency of the signals generated by the standby clock source. However, most of the time, the phase of the two clock sources are different. A substantial phase difference between the two clock sources may lead to unacceptable data loss and errors when the first clock source is switched with the standby clock source.

Figure 1:
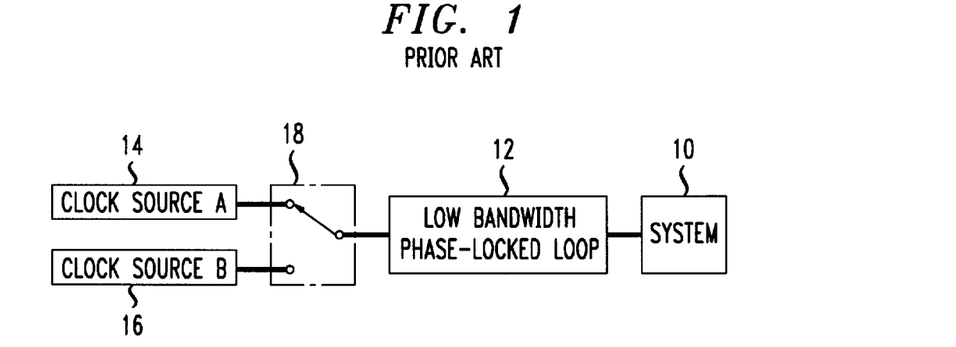
FIG. 1 illustrates a prior art system.

FIG. 1 illustrates a prior art system employed to alleviate the consequences of such switching errors. A low bandwidth phase-locked loop is employed to receive the signals provided by the selected clock source and the standby clock source. Thus, FIG. 1 illustrates a system 10 that operates based on clock signals such as electrical pulses generated by clock source 14 or standby clock source 16. The output port of clock source 14 is coupled to an input port of a low bandwidth phase-locked loop 12 via a switch 18. Furthermore, the output port of phase locked-loop 12 is coupled to an input port of system 10. During operation, system 10 receives its clock signals from clock source 14 via phase-locked-loop 12 which generates clock signals that are substantially in-phase with the signals generated by clock source 14.

Once it is desired to operate system 10 from standby clock source 16, switch 18 is activated to connect the output port of clock 16 to the input port of phase-locked-loop 12. The frequency of the signals generated by standby clock source 16 is substantially the same as the frequency of the signals generated by clock source 14. However, the phase of the signals may be different and misaligned. One of the purposes to employ phase-locked-loop 12 is to smoothen the effect of the phase jump caused by the standby clock source 16, as seen by system 10.

Phase-locked-loop 12 functions as a low pass filter in the phase domain. To this end the phase of signals generated at the output port of phase-locked-loop 12 gradually change until it is substantially aligned with the phase of the signals generated by standby clock source 16. It is noted that the rate of change of the phase of the signals at the output port of the phase-locked-loop, among other things depends on the bandwidth of the system. Thus, the lower the bandwidth of the phase-locked-loop the slower the rate of change of the phase of the signals. As a result, it is desirable to design the phase-locked-loop so that it exhibits a substantially low bandwidth. Consequently, the transition of the phase of the signals at the output of the phase-locked loop from one phase relating to clock source 14 to a second phase relating to clock source 16 may appear seamless, leading to substantially low data error rates.

A problem with the arrangement illustrated in FIG. 1 is that low bandwidth phase-locked-loops, particularly those employing CMOS technology, exhibit unacceptable jitter signals as the bandwidth decreases. This jitter is typically originated from thermal and flicker noise associated with the operation of a monolithic ring oscillator employed in the phase-locked-loop. One way to overcome this problem is to employ a voltage-controlled crystal oscillator. This solution provides acceptable jitter characteristics. However, this solution is not amenable to integrated circuit manufacturing. Furthermore, it leads to higher manufacturing costs.

Thus, there is a need for a system that aligns the phase of the output clock signals generated from a standby clock source with the phase of the signals generated by an active clock source when the clock sources are switched.

SUMMARY OF THE INVENTION

In accordance with one embodiment of the invention, a system is described that aligns the phase of signals generated by a selectable standby clock source having a predetermined frequency with the phase of signals generated by a selected clock source having the same frequency as signals generated by the standby clock source. The system comprises a multistage delay line having a plurality of delay elements. The delay line is configured to receive the signals generated by the standby clock source, such that the output signal of each delay element is a delayed version of the standby clock source signal.

A decoder is configured to receive each of the delayed versions of the standby clock source signals and generate a selection signal corresponding to a desired one of the delayed version signals that is aligned with the selected clock source signal within a specifiable phase difference. A selector is configured to receive the selection signal so as to select the desired delayed version signal as a new standby clock.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE INVENTION

Figure 2:
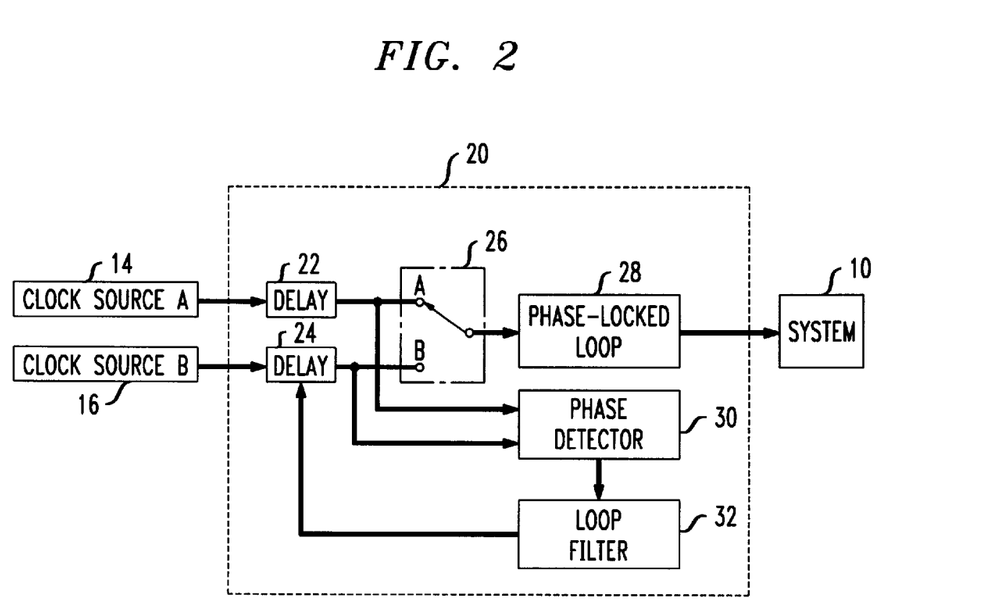
FIG. 2 illustrates a phase aligner circuit in accordance with one embodiment of the present invention.

FIG. 2 illustrates a phase aligner circuit 20 in accordance with one embodiment of the present invention, although the invention is not limited in scope to this embodiment. Clock source 14 and standby clock source 16 are coupled to a first and second input port of phase aligner circuit 20.

Phase aligner circuit 20 includes a first delay circuit 22, which is configured to receive the clock signals generated by clock source 14. An output port of delay circuit 22 is coupled to an input port A of switch 26, and to an input port of a phase detector 30. An output port of switch 26 is coupled to an input port of a phase-locked loop 28. The output port of phase-locked-loop 28 is coupled to an input port of system 10.

Phase aligner circuit 20 also includes a variable delay circuit 24, which is configured to receive the clock signals generated by standby clock source 16. Delay circuit 24 is capable of providing delayed versions of clock signals generated by clock source 16. The output port of delay circuit 24 is coupled to a second input port of phase detector 30, and to an input port B of switch 26 respectively. The output port of phase detector 30 is coupled to an input port of loop filter 32. An output port of loop filter 32 is coupled to the control input port of delay circuit 24.

Phase detector 30 is configured to generate an output voltage signal that is proportional to the phase difference between the delayed clock signals generated by clock sources 14 and 16 respectively. In one embodiment of the present invention, phase detector 30 includes an exclusive OR gate configured to receive the clock signals generated at the output port of delay circuits 22 and 24 respectively. When the two signals are aligned, the output of the exclusive OR gate is a logical zero. However, when the two signals are not aligned, the exclusive OR gate generates a signal pulse, whose width is proportional to the phase lag between the two signals.

Loop filter 32 is configured to provide to delay circuit 24 a control voltage signal that is proportional to the average value of the signal generated by phase detector 30. Thus, during operation delay circuit 24 provides a delayed version of the clock signal generated by standby clock source 16 based on the control voltage signal provided by loop filter 32. Once the feedback loop comprising of delay circuit 24, phase detector 30 and loop filter 32 is substantially stabilized, the delayed version of clock signals provided by delay circuit 24 will be substantially aligned with the clock signals generated at the output of delay circuit 22. In effect, loop filter 32 generates a desired voltage control signal to delay circuit 24, such that the delayed version of the standby clock source 16 is substantially aligned with the signal generated by delay circuit 22. Thus, when switch 26 connects the output port of delay circuit 24 to phase-locked-loop 28, the switching between clock source 14 and clock source 16 would appear to be substantially seamless.

Any remaining phase differences between the signals generated at the output of delay circuit 24 and delay circuit 22 respectively may be slowly aligned by phase-locked-loop 28 as explained above in connection with the description of FIG. 1. However, unlike the system discussed in reference with FIG. 1 where a substantially low bandwidth phase-locked-loop is desired, phase aligner circuit 20 does not require such a substantially low bandwidth phase-locked-loop. This follows because the phases coupled to the phase-locked-loop have been already substantially aligned. As a result the jitter problems associated with a low bandwidth phase-locked-loop may be substantially eliminated in accordance with the present invention.

It is noted that although the phase aligner circuit described in reference with FIG. 2 includes a phase-locked-loop 28, in accordance with another embodiment of the invention, system 10 may be directly coupled to switch 26 without the presence of a phase-locked-loop.

Figure 3:
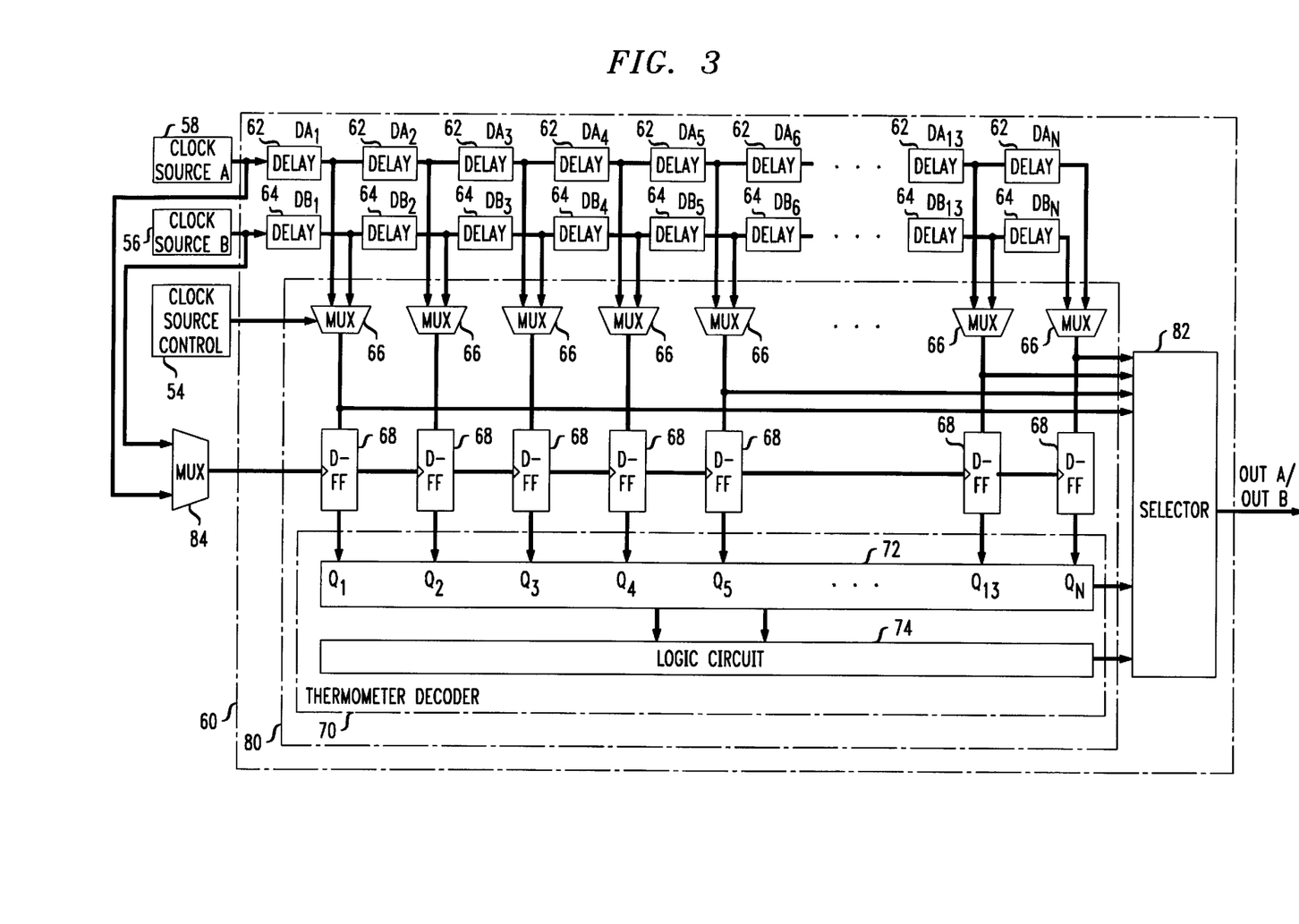
FIG. 3 illustrates a phase aligner circuit in accordance with another embodiment of the present invention.

FIG. 3 illustrates a phase aligner circuit 60 in accordance with another embodiment of the present invention, although the invention is not limited in scope in that respect. Phase aligner circuit 60 is configured to receive signals from a selected clock source, such as clock source 58. The phase aligner is also configured to receive signals from a selectable clock source such as clock source 56. A clock source control circuit 54 generates a clock selection signal based on the clock source currently selected.

Phase aligner circuit 60 includes a first multi-stage delay line that comprises a plurality of N delay elements 62, coupled in series, where N is a specifiable integer. Each delay element 62 is configured to provide a delayed version of the clock signals generated by clock source 58. Therefore, the clock signals provided at the output port of the first delay element 62 are a version of clock signals generated by clock source 58, which are delayed by one delay unit, $\Delta T$, where $\Delta T$ is a specifiable time. Similarly, the clock signals provided at the output port of the second delay element 62 are a version of clock signals generated by clock source 58, which are delayed by two delay units. Finally, the clock signals provided at the output port of the $N^{th}$ delay element 62 are a version of clock signals generated by clock source 58, which are delayed by N delay units.

Phase aligner circuit 60 also includes a second multi-stage delay line that comprises a plurality of N delay elements 64, coupled in series, where N is a specifiable integer. Each delay element 64 is configured to provide a delayed version of the clock signals generated by clock source 56. Therefore, the clock signals provided at the output port of the first delay element 64 are a version of clock signals generated by clock source 56, which are delayed by one delay unit, $\Delta T$, where $\Delta T$ is a specifiable delay time as explained below. Similarly, the clock signals provided at the output port of the second delay element 64 are a version of clock signals generated by clock source 56, which are delayed by two delay units. Finally, the clock signals provided at the output port of the $N^{th}$ delay element 64 are a version of clock signals generated by clock source 56, which are delayed by N delay units.

In accordance with one embodiment of the invention each delay element 62 and 64 comprises a pair of inverters coupled in series. The delay of each delay element is substantially equal to the phase lag between the output signal and the input signal of the inverter pair.

It is noted that under a worst case scenario the phase difference between the signals generated by clock source 58 and the signals generated by clock source 56 is at most, one clock period. This follows because any phase difference larger than one clock period is repeated again. Thus, in accordance with one embodiment of the invention, the total delay time of the N delay elements in each multi-stage delay line is at least equal to one clock period.

The output port of each delay element 62 is coupled to an input port of a decoder circuit 80. The decoder circuit includes a plurality of multiplexers 66 each configured to receive the signals generated by delay elements 62 and 64. For example in accordance with one embodiment of the invention, the output port of each delay element 62 is coupled to an input port of a corresponding multiplexer 66. Similarly, the output port of each delay element 64 is coupled to the second input port of the corresponding multiplexer 66. Thus, decoder circuit 80, in accordance with one embodiment of the present invention includes N multiplexers each configured to receive a delayed version of signals generated by clock sources 58 and 56 respectively.

Each multiplexer 66 is configured to select the delayed versions of the signals generated by the standby clock source, in response to the control signal generated by clock source control circuit 54. For example, if clock source 58 is a selected clock source employed by an electrical system, clock source 56 would be a selectable standby clock source. Clock source control circuit generates a control signal so that the delayed signals generated by each delay element 64 are selected by each multiplexer 66.

As illustrated in FIG. 3 the output port of each multiplexer 66 is coupled to an input port of a selector 82. Selector 82 is configured to receive a control signal that selects the desired delayed version of the signal provided at the output port of one of the multiplexers 66.

The output port of each multiplexer 66 is coupled to an input port of a D-flip-flop 68. The clock input port of each flip-flop 68 is configured to receive the signals generated by the currently selected clock source via multiplexer 84. Thus for example, when clock source 58 is selected to provide clock signals to an electrical system and clock source 56 is the standby clock source, clock source control circuit 54 causes multiplexer 84 to select clock source 58 so that the clock input port of each D flip-flop 68 receives the signals generated by clock source 58. On the other hand, when clock source 56 is selected to provide clock signals to an electrical signal and clock source 58 is the standby clock source, the clock input port of each D flip-flop 68 receives the signals generated by clock source 56.

In accordance with one embodiment of the present invention, each D flip-flop 68 is a positive edge triggered flip-flop, although the invention is not limited in scope in that respect. Thus, the signal Q at the output port of each flip-flop will have the same value as the signal at its input port, when the input clock signal to the flip-flop goes from a logical "0" to a logical "1". As illustrated in FIG. 3, the output port of each flip-flop 68 generates output bits or signals, such as $Q_1$ corresponding to the first delay element, up to $Q_N$ corresponding to the $N^{th}$ delay element.

The output ports of flip-flops 68 are coupled to the input ports of a thermometer decoder 70, which stores the bits or signals $Q_1$ through $Q_N$ in an N-bit register 72. The output port of register 72 is coupled to an input port of a logic circuit 74, which is configured to generate a selection signal that corresponds to a desired one of the delayed version signals generated by one of the delay elements. It is noted that depending on the design requirements as explained below in more detail a delayed version is selected such that it would be aligned with the currently selected clock source within a specifiable phase difference. In one embodiment of the invention the delayed version that is best aligned with the currently selected clock source is selected.

The selection signal generated by logic circuit 74 is coupled to an input port of a selector 82. As such the output port of selector 82, referred to as Out A/Out B, provides a clock signal which is a delayed version of a clock signal generated by the standby clock source, so that when the currently selected clock source is switched to the standby clock source, the phase difference between the clock signals are substantially small in accordance with a specifiable phase difference range.

In one example of the phase aligning operation, phase aligner 60 receives clock signals from a currently selected clock source, such as clock source 58 and from a selectable standby clock source such as clock source 56. In this example the currently selected clock source 58 provides the clock signals to an electrical system that operates based on such clock signals. To this end clock source control 54 generates a control signal to multiplexers 66 so as to provide the delayed version of clock signals generated by standby clock source 56 to flip-flops 68. Furthermore, the input clock port of each flip-flop is configured to receive the clock signals generated by clock source 58.

Thermometer decoder 70 stores the outputs $Q_1$ through $Q_N$ in register 72. In accordance with one embodiment of the invention and as explained in more detail below, logic circuit 74 generates a selection signal based on the arrangement of "1's" and "0's" stored in register 72. Typically, the arrangements of "1's" and "0's" form a data pattern known in the art as a thermometer code. Briefly, a thermometer code comprises a stream of sequential "1's" and "0's" following each other. Thus, for example, logic circuit 74 determines which output signal Q has the last "1" in a sequential stream before the stream of "0's" begin. Consequently, thermometer decoder 70 generates a selection signal that corresponds to the multiplexer that provided a signal that caused that last Q-bit or signal "1" to be generated.

In accordance with one embodiment of the invention, logic circuit 74 comprises multiple input gates that detect the first transition from a logical "1" to a logical "0" and generate a selection signal corresponding to such detection.

FIGS. 4a–h are plots of a timing diagram that illustrate the operation of phase aligner 60 as discussed above. Thus, in accordance with one embodiment of the invention, clock source 58 generates a clock signal such as 110. Similarly, clock source 56 generates a clock signal such as 112. As illustrated, clock signal 112 lags clock signal 110 by approximately 4.5 ΔT's, wherein ΔT is a specifiable unit of time according to design requirements. It is noted that in the example illustrated by FIGS. 4a–h, clock source 58 is the currently selected clock source and clock source 56 is the selectable standby clock source. For this example, each multi-stage delay line in FIG. 3 comprises 16 delay elements 62 and 64 respectively. Furthermore, register 72 is 16 bit wide.

Clock signal 116 is the delayed version of clock signals generated by standby clock source 56 at the output port of the first delay element 64. Clock signal 118 is the delayed version of clock signals generated by standby clock source 56 at the output port of the second delay element 64. Similarly, clock signals 120–124 are the delayed versions of clock signals generated by standby clock signals source 56 at the output ports of the $10^{th}$ through $12^{th}$ delay element 64 respectively. Finally, the output port of the $16^{th}$ delay element provides clock signal 126.

Figures 4A, 4B:
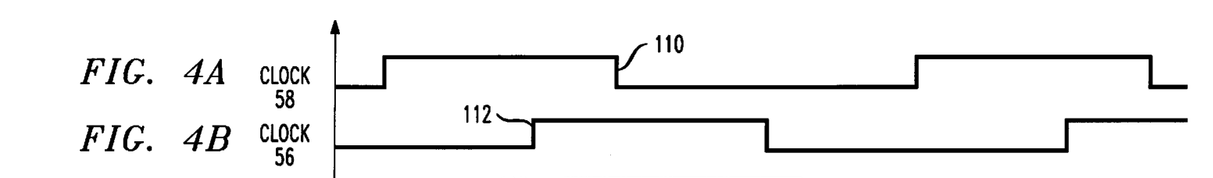
FIGS. 4a–h are plots of a timing diagram that illustrate the operation of phase aligner as discussed in reference with FIG. 3.
Figure 4C:
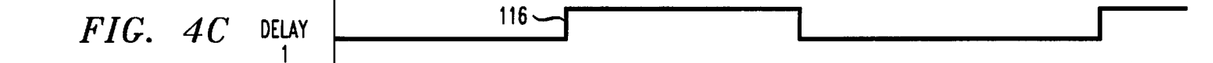
Figure 4D:
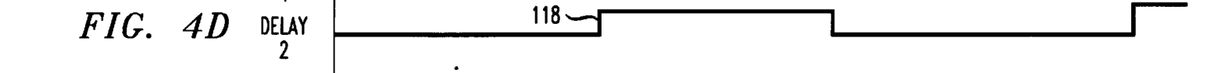
Figure 4E:
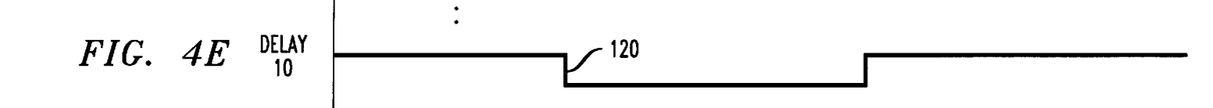
Figure 4F:
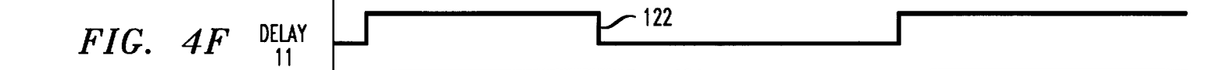
Figure 4G:
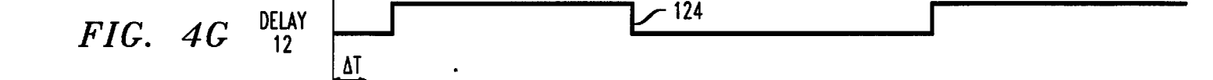
Figure 4H:
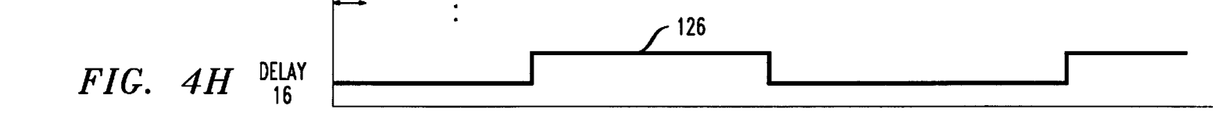
Figure 4I:
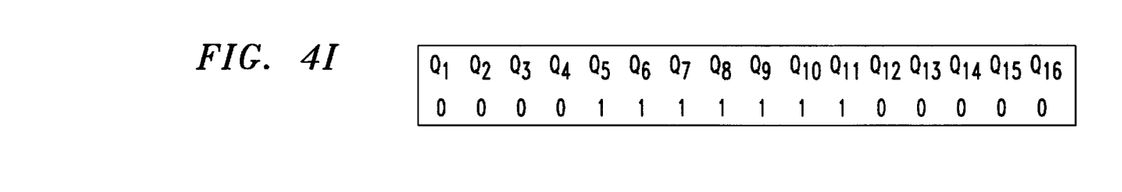
FIG. 4i illustrates a thermometer code generated in accordance with one embodiment of the present invention.

FIG. 4i illustrates the value of bits Q in accordance with the timing diagram illustrated in FIGS. 4a–h. To this end register 72 stores a thermometer code such as the one illustrated in FIG. 4i. In accordance with one embodiment of the invention, logic circuit 74 (FIG. 3) generates a selection signal so as to select the delayed version provided at the output of the $11^{th}$ delay element, since $Q_{11}$ is the last bit with a value "1" in a stream of sequential "1's".

It is noted that logic circuit 74 (FIG. 3) advantageously generates a selection signal so as to select the delayed version provided at the output of the delay element that causes the first "0" after a sequence of "1's" in the thermometer code. For example for the timing diagram illustrated in FIGS. 4a–h, logic circuit 74 generates a selection signal so as to select the delayed version provided at the output of the 11$^{th}$ delay element, since $Q_{12}$ is the first bit with a value "0" after a sequential stream of "1's."

FIGS. 5a–h illustrate another example of the timing diagram of clock signals generated by clock sources 58 and 56 respectively in accordance with one embodiment of the invention. As illustrated the duty cycle of clock signals is different than the duty cycle of the clock signals illustrated in FIGS. 4a–h. However, as shown herein, the phase aligner circuit according to one embodiment of the invention provides the desired result regardless of the duty cycle of the clock signals generated by the currently selected clock source and the standby clock source.

Figure 5A:
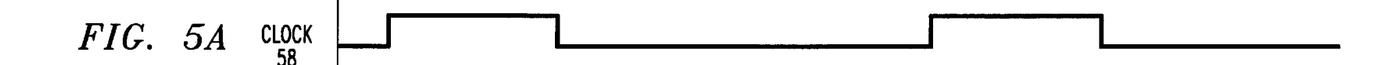
FIGS. 5a–h, 6a–h and 5i, 6i respectively illustrate plots of timing diagrams corresponding to the operation of a phase aligner circuit as discussed in reference with FIG. 3 and the resulting thermometer code.
Figure 5B:
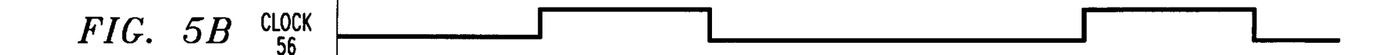
Figure 5C:
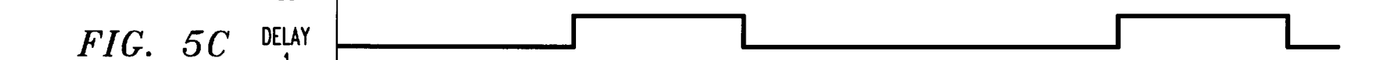
Figure 5D:
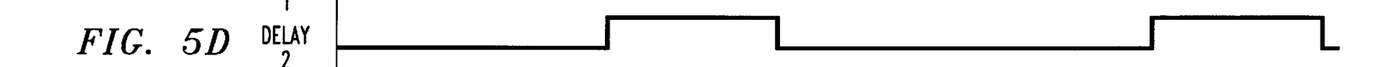
Figure 5E:
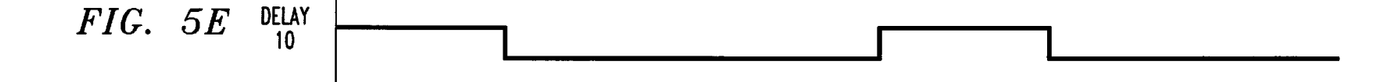
Figure 5F:
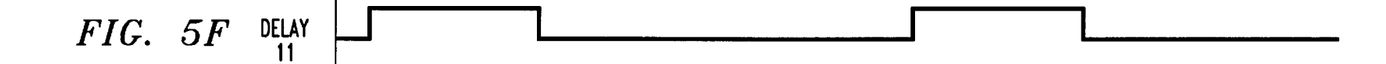
Figure 5G:
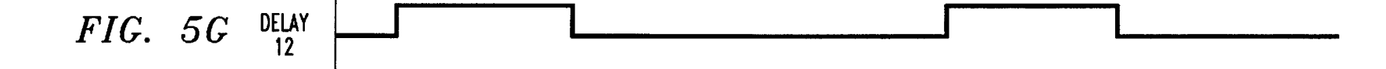
Figure 5H:
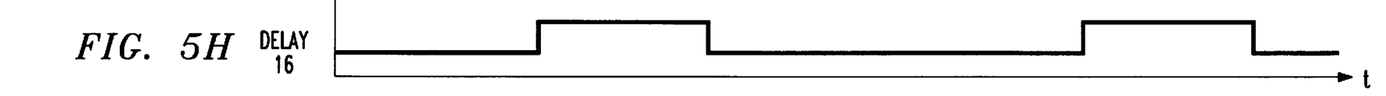
Figure 5I:
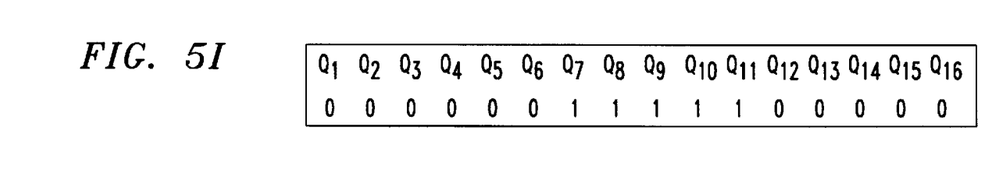

FIG. 5i illustrates the thermometer code generated in response to the clock signals generated by the currently selected clock sources 58, standby clock source 56, and the delay elements that provide delayed versions of the standby clock source. As illustrated the length of the sequential "1's" is less than the length of sequential "1's" in the thermometer code represented in FIG. 4i. Thermometer decoder 70 (FIG. 3) generates a selection signal that corresponds to the multiplexer that provided a signal that caused that last Q signal "1" to be generated, before a stream of "0's" have begun. The last Q signal "1", in this example, corresponds to the 11$^{th}$ delay element. As such the delayed version of the standby clock source 56 provided by the 11$^{th}$ delay element is selected as the desired standby clock source when it is necessary to switch the currently selected clock source to the standby clock source.

FIGS. 6a–e illustrate still another example of the timing diagram of clock signals generated by clock sources 58 and 56 respectively in accordance with one embodiment of the invention. As illustrated the clock signals have a phase difference which is different from the phase difference of clock signals illustrated in FIGS. 4a–h and 5a–h. However, as shown herein, the phase aligner circuit according to one embodiment of the invention provides the desired result regardless of the phase difference between the clock signals generated by the currently selected clock source and the standby clock source.

Figure 6A:
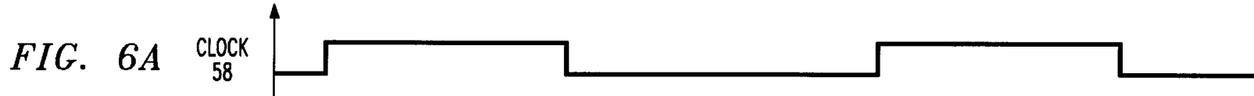
Figure 6B:
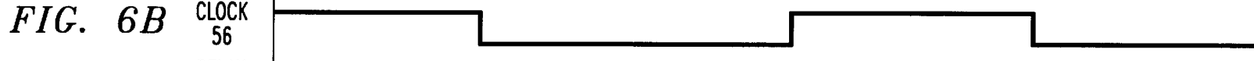
Figure 6C:
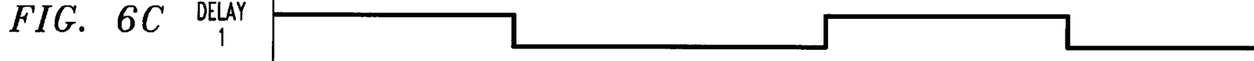
Figure 6D:
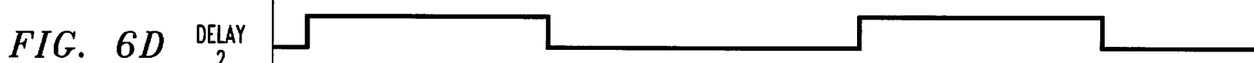
Figure 6E:
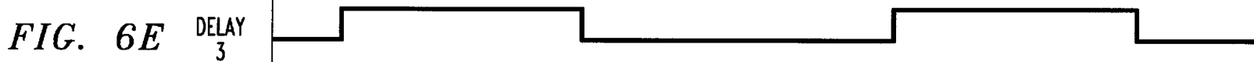
Figure 6F:
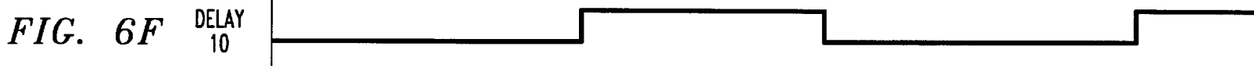
Figure 6G:
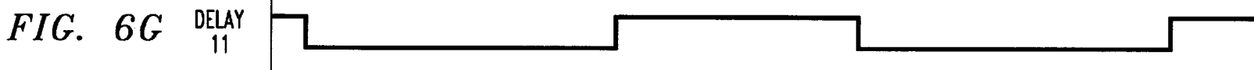
Figure 6H:
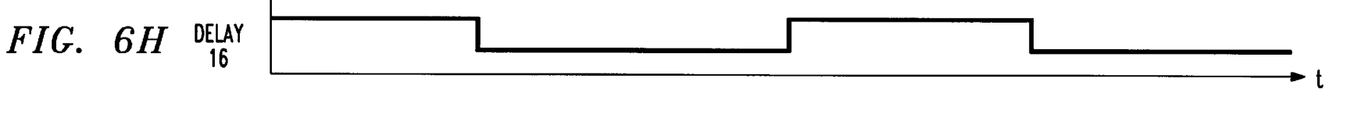
Figure 6I:
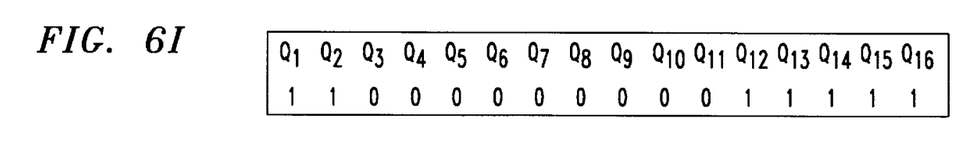

FIG. 6f illustrates the thermometer code generated in response to the clock signals generated by the currently selected clock sources 58, standby clock source 56, and the delay elements that provide delayed versions of the standby clock source. As illustrated thermometer decoder 70 (FIG. 3) generates a selection signal that corresponds to the multiplexer that provided a signal that caused that last Q signal "1" to be generated, before a stream of "0's" have begun. The last Q signal "1", in this example, corresponds to the 2nd delay element. As such the delayed version of the standby clock source 56 provided by the 2nd delay element is selected as the desired standby clock source when it is necessary to switch the currently selected clock source to the standby clock source.

The accuracy of phase aligner 60 depends, among other things, on the number of delay elements employed. An example of determining the accuracy of phase aligner 60 is explained hereinafter. In this example, clock sources 58 and 56 of FIG. 3, each generate a clock signal having a frequency of 1 MHZ, or a period of 1 μs. In accordance with one embodiment of the invention as explained above, the number of delay elements spans at least 1 μs. Thus the delay at each delay stage is equal to ¹⁄₁₆ as or 62.5 nano seconds "ns". This means that a 16-stage delay line in phase aligner 60 provides an alignment between the two clock signals within 62.5 ns accuracy. If for example the system specification requires an accuracy of 5 ns, the number of delay element may be increased. Thus, for a clock signal period of 1 μs it is necessary to have $$\frac{.}{\eta} = 200 \text{ delay elements.}$$

Figure 7:
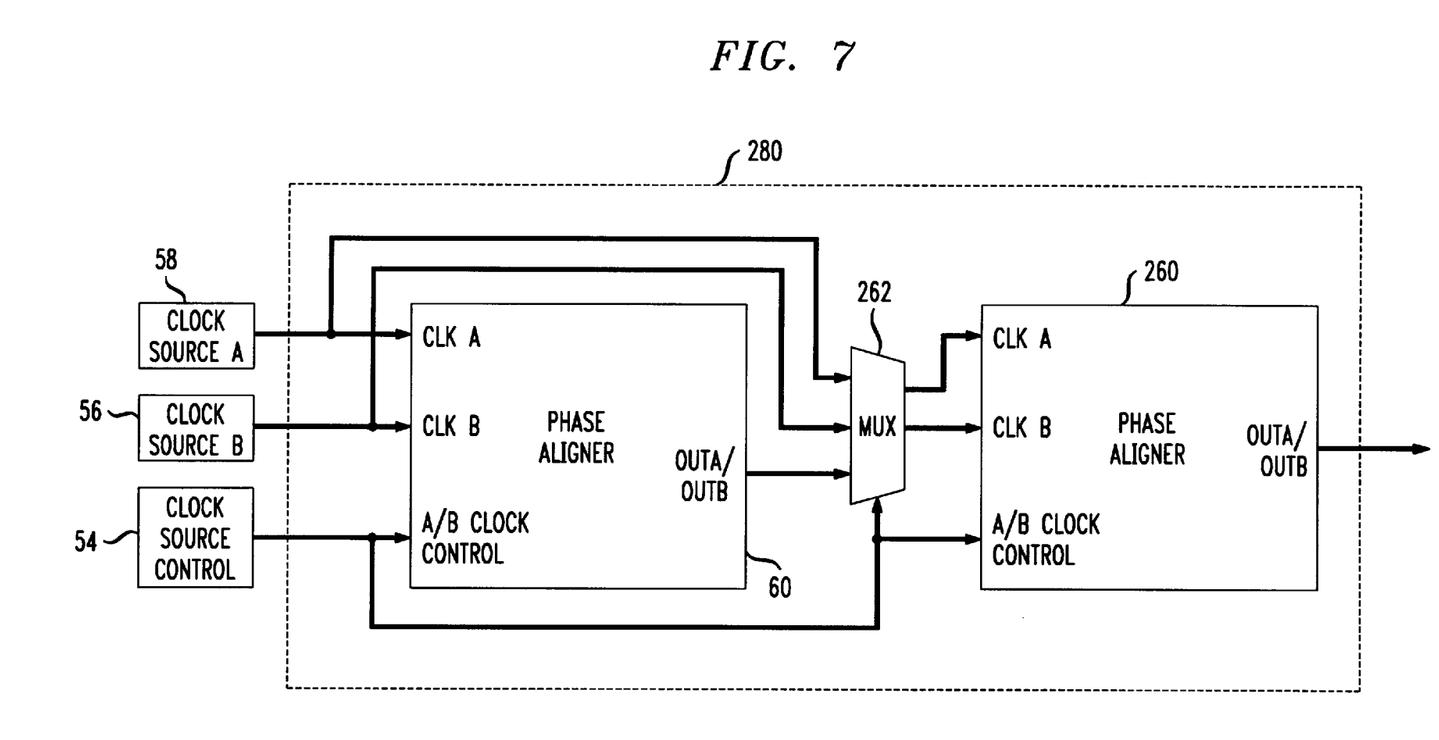
FIG. 7 illustrates a two stage phase aligner in accordance with another embodiment of the invention.

This number of delay elements may be unacceptably large for some design applications. Thus, in accordance with another embodiment of the invention two phase aligner circuits are coupled together as illustrated in FIG. 7 so that phase alignment takes place in two stages. The first stage may be characterized as a coarse alignment stage and the second stage may be characterized as a fine alignment stage as will be explained in more detail hereinafter.

FIG. 7 illustrates a two stage phase aligner 280 that comprises a coarse phase aligner 60 and a fine phase aligner 260. Both phase aligners 60 and 260 are configured to receive the currently selected clock signal. However, phase aligner 260 is configured to receive the delayed version of clock signals generated by the standby clock source as selected by phase aligner 60. A multiplexer 262 is configured to receive clock signals generated by clock source 58, clock source 56, and the output signal of the phase aligner 60. The control input port to multiplexer 262 is configured to receive the signal generated by clock source control circuit 54.

Each phase aligner includes a first input port CLKA and a second input port CLKB for receiving the currently selected clock signal and the standby selectable clock signal. Thus, multiplexer 262 couples the currently selected clock source to either input port CLKA or input port CLKB of phase aligner 260 depending on the control signal generated by clock control circuit 54. For example, when the currently selected clock source is clock source 58 and the standby selectable clock source is clock source 56, multiplexer 262 couples the clock signals generated by clock source 58 to input port CLKA of phase aligner 260. Furthermore, the output signal of phase aligner 60 (OUTB) is coupled to the CLKB input port of phase aligner 260 via multiplexer 262. Conversely, when the currently selected clock source is clock source 56 and the standby selectable clock source is clock source 58, multiplexer 262 couples the clock signals generated by clock source 56 to input port CLKB of phase aligner 260 and the output signal of first aligner 60 to the input port CLKA of aligner 260.

Thus in accordance with one embodiment of the invention, clock source 58 is the currently selected clock source and clock source 56 is the standby clock source. The frequency of the clock signals is the same 1 MHZ as the example described above. Thus, coarse phase aligner 60 provides a delayed version of clock source 56 within 62.5 ns accuracy as derived before. Phase aligner 260 is configured to treat the output clock signal of phase aligner 60 as its new standby clock source. Thus phase aligner 260 functions to align a phase difference of approximately 62.5 ns to within 5 ns accuracy. As such, phase aligner 260 is configured to employ at least 13 delay elements, wherein each delay element provides a phase delay of 5 ns.

Figure 8A:
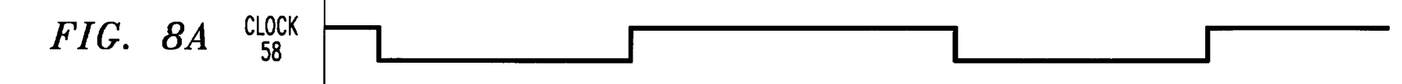
FIGS. 8a–e and 8f illustrate plots of timing diagrams at the output of the first stage of a phase aligner circuit having a two-stage alignment in accordance with one embodiment of the invention, and a corresponding thermometer code.
Figure 8B:
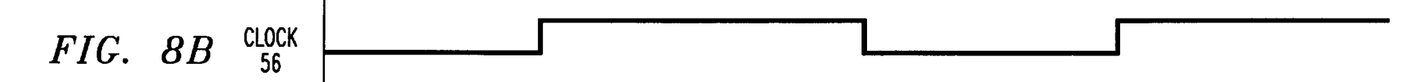
Figure 8C:
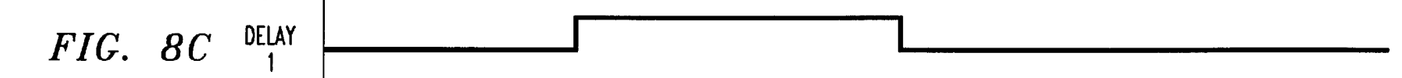
Figure 8D:
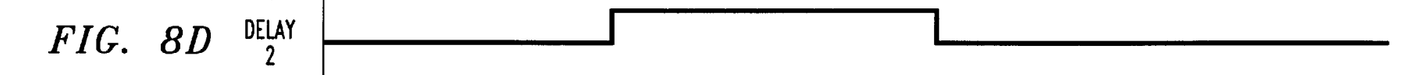
Figure 8E:
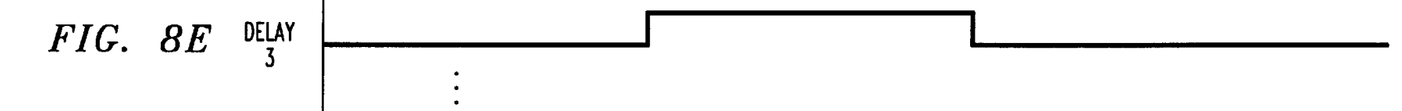
Figure 8F:
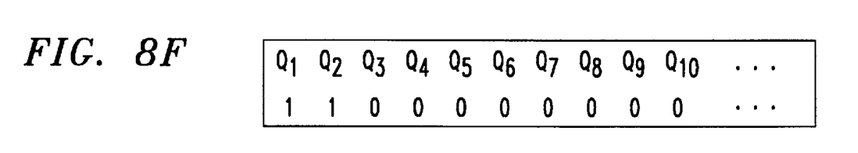

FIGS. 8a–8e illustrate the timing diagram of the clock signals with the coarse aligner 60 of FIG. 7. The thermometer code in FIG. 8f indicates that the closest phase of the standby clock source 56 is the one from the second delay element. The fine aligner takes clock 58 and this coarsely aligned clock and does a further alignment as explained below.

FIGS. 9a–e illustrate the timing diagram of clock signals generated by clock sources 58 and the selected delayed standby clock signal provided at the output port of phase aligner 60. As illustrated phase aligner 260 according to one embodiment of the invention provides a phase alignment within the desired accuracy. Note that the time axis is enlarged as compared to the previous timing diagrams.

Figure 9A:
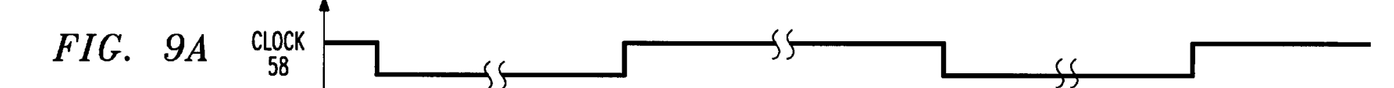
FIGS. 9a–e and 9f illustrate plots of timing diagrams corresponding to the operation of the two-stage phase aligner as discussed in reference with FIG. 7 and the resulting thermometer code.
Figure 9B:
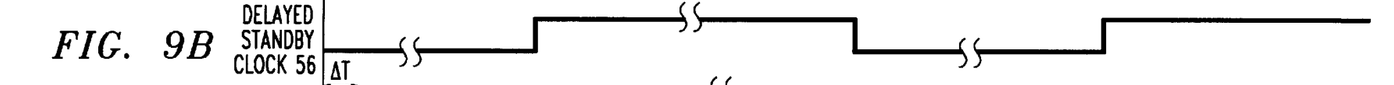
Figure 9C:
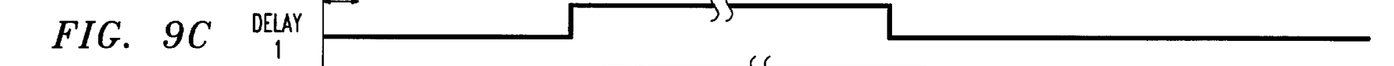
Figure 9D:
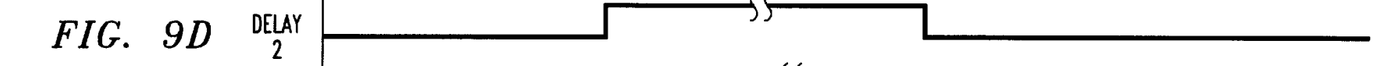
Figure 9E:
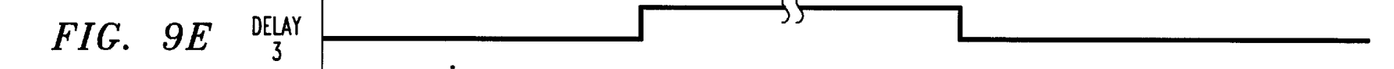
Figure 9F:
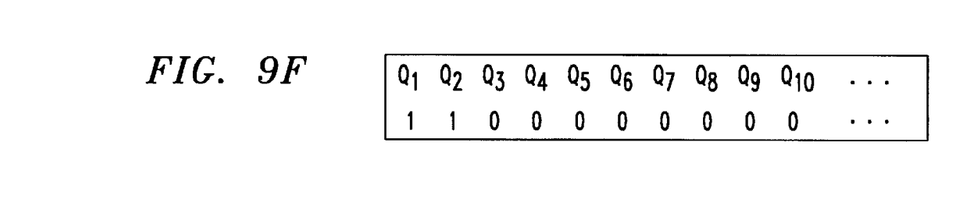

FIG. 9f illustrates the thermometer code generated in response to the clock signals generated by the currently selected clock sources 58, the output clock source provided by phase aligner 60, and the delay elements in phase aligner 260 that provide delayed versions of the clock signal provided by phase aligner 60. As illustrated the thermometer decoder in phase aligner 260 generates a selection signal that corresponds to the multiplexer that provided a signal that caused that last Q signal "1" to be generated, before a stream of "0's" have begun. The last Q signal "1", in this example, corresponds to the 2nd delay element. As such the delayed version of the clock signal provided by course phase aligner 60 at the output port of the 2nd delay element in phase aligner 260 is selected as the desired standby clock source when it is necessary to switch the currently selected clock source to the standby clock source.

It is further noted that in accordance with another embodiment of the invention a plurality of modular phase aligners such as phase aligner 60 may be manufactured in an integrated circuit IC arrangement. Each IC module is then coupled in accordance with the same principles discussed in reference with FIG. 7 so as to provide phase alignment within any desired degree of accuracy by passing the standby clock signals through multiple stages of phase alignment.

While only certain features of the invention have been illustrated and described herein, many modifications, substitutions, changes or equivalents will now occur to those skilled in the art. It is therefore, to be understood that the appended claims are intended to cover all such modifications and changes as fall within the true spirit of the invention.

I claim:

1. A phase aligner system for aligning the phase of signals generated by a first and second selectable clock sources, said first clock source designated as a standby clock source having a predetermined frequency with the phase of signals generated by said second clock source designated as a clock source having the same frequency as signals generated by said designated standby clock source, said system comprising:

a first selector coupled to said designated clock source so as to provide signals generated by said designated clock source to an output port of said phase aligner system;

a delay line having a plurality of delay elements each providing an output signal, said delay line configured to receive said signals generated by said designated standby clock source, such that the output signal of each delay element is a delayed version of said designated standby clock source;

a decoder configured to receive each of said delayed versions of said signals generated by said designated standby clock signal source and generate a selection signal corresponding to a desired one of said delayed version signals that is aligned with signals generated by said designated clock source within a specifiable phase difference; and a second selector configured to receive said selection signal so as to select said desired delayed version signal as a new standby clock source, said second selector being coupled to said first selector, so that said first selector provides at its output port signals generated by either said designated clock source and said second selector.

2. The system in accordance with claim 1 wherein said decoder comprises:

a plurality of flip-flops configured to receive said delayed version signals provided by said delay elements, wherein said flip-flops receive a clock signal generated by said designated clock source so as to generate a thermometer code;

a thermometer decoder configured to receive said thermometer code provided by said flip-flops so as to generate said selection signal corresponding to signals provided by a delay element that causes the last signal bit "1" in said thermometer code to be generated prior to a sequence of bit "0's" in said thermometer code are generated.

3. The system in accordance with claim 2 wherein said flip-flops comprise positive edge triggered D flip-flops.

4. The system in accordance with claim 1 wherein said second selector comprises a multiplexer that selects the output signal generated by one of said delay elements.

5. The system in accordance with claim 1, further comprising:

a second delay line having a plurality of delay elements configured to receive said signals generated by said designated clock source such that each delay element provides a delayed version of said signals generated by said designated clock source;

a plurality of multiplexers configured to receive said clock signals provided by said delay elements in said first and second delay lines so as to select delayed versions of clock signals generated by said first and second clock sources which is designated as a standby clock source.

6. The system in accordance with claim 1 wherein the total delay caused by said delay elements is at least equal to the period of said signals generated by said designated standby clock source.

7. The system in accordance with claim 6 wherein the accuracy of alignment between the phase of said signals generated by said first and second clock signals is within the range of delay time caused by each delay element.

8. A system for aligning the phase of signals generated by a first and second selectable clock sources, said first clock source designated as a standby clock source having a predetermined frequency with the phase of signals generated by said second clock source designated as a clock source having the same frequency as signals generated by said designated standby clock source, said system having at least two phase aligner systems coupled together, wherein each of said phase aligner systems comprises:

a first selector coupled to said designated clock source so as to provide signals generated by said designated clock source to an output port of said phase aligner system;

a delay line having a plurality of delay elements each providing an output signal said delay line configured to receive said signals generated by said designated standby clock source, such that the output signal of each delay element is a delayed version of said designated standby clock source;

a decoder configured to receive each of said delayed versions of said signals generated by said designated standby clock signal source and generate a selection signal corresponding to a desired one of said delayed version signals that is aligned with signals generated by said designated clock source within a specifiable phase difference; and a second selector configured to receive said selection signal so as to select said desired delayed version signal as a new standby clock source, said second selector being coupled to said first selector, so that said first selector provides at its output port signals generated by either said designated clock source and said second selector, said phase aligner systems coupled together such that the selected delayed version of signals generated by said designated standby clock source provided by one of said phase aligner systems is coupled to an input port of the following phase aligner system.

9. A phase aligner system in accordance with claim 8 wherein the delay caused by delay elements in said second phase aligner system is smaller than the delay caused by delay elements in said first phase aligner system.

10. In an integrated circuit, a system for aligning the phase of signals generated by a first and second selectable clock sources, said first clock source designated as a standby clock source having a predetermined frequency with the phase of signals generated by said second clock source designated as a clock source having the same frequency as signals generated by said designated standby clock source, said system comprising:

a first selector coupled to said designated clock source so as to provide signals generated by said designated clock source to an output port of said phase aligner system;

a delay line having a plurality of delay elements, each providing an output signal, said delay line configured to receive said signals generated by said designated standby clock source, such that the output signal of each delay element is a delayed version of said designated standby clock source;

a decoder configured to receive each of said delayed versions of said signals generated by said designated standby clock signal source and generate a selection signal corresponding to a desired one of said delayed version signals that is aligned with signals generated by said designated clock source within a specifiable phase difference; and a second selector configured to receive said selection signal so as to select said desired delayed version signal as a new standby clock source, said second selector being coupled to said first selector, so that said first selector provides at its output point signals generated by either said designated clock source and said second selector.

11. The system in accordance with claim 10 wherein said decoder comprises:

a plurality of flip-flops configured to receive said delayed version signals provided by said delay elements, wherein said flip-flops receive a clock signal generated by said designated clock source so as to generate a thermometer code;

a thermometer decoder configured to receive said thermometer code provided by said flip-flops so as to generate said selection signal corresponding to signals provided by a delay element that causes the last signal bit "1" in said thermometer code to be generated prior to a sequence of bit "0's" in said thermometer code are generated.

12. The system in accordance with claim 11 wherein said flip-flops comprise positive edge triggered D flip-flops.

13. The system in accordance with claim 10 wherein said second selector comprises a multiplexer that selects the output signal generated by one of said delay elements.

14. The system in accordance with claim 10, further comprising:

a second delay line having a plurality of delay elements configured to receive said signals generated by said designated clock source such that each delay element provides a delayed version of said signals generated by said designated clock source;

a plurality of multiplexers configured to receive said clock signals provided by said delay elements in said first and second delay lines so as to select delayed versions of clock signals generated by said first and second clock sources.

15. The system in accordance with claim 10 wherein the total delay caused by said delay elements is at least equal to the period of said signals generated by said designated standby clock source.

16. The system in accordance with claim 15 wherein the accuracy of alignment between the phase of said signals generated by said first and second clock signals is within the range of delay time caused by each delay element.

17. In an integrated circuit, a system for aligning the phase of signals generated by first and second selectable clock sources said first clock source designated as a standby clock source having a predetermined frequency with the phase of signals generated by said second clock source designated as a clock source having the same frequency as signals generated by said designated standby clock source said system having at least two phase aligner systems coupled together, wherein each of said phase aligner systems comprises:

a first selector coupled to said designated clock source so as to provide signals generated by said designated clock source to an output port of said phase aligner system;

a delay line having a plurality of delay elements each providing an output signal, said delay line configured to receive said signals generated by said designated standby clock source, such that the output signal of each delay element is a delayed version of said designated standby clock source;

a decoder configured to receive each of said delayed versions of said signals generated by said designated standby clock signal source and generate a selection signal corresponding to a desired one of said delayed version signals that is aligned with signals generated by said designated clock source within a specifiable phase difference; and a second selector configured to receive said selection signal so as to select said desired delayed version signal as a new standby clock source, said second selector being coupled to said first selector, so that said first selector provides at its output port signals generated by either said designated clock source and said second selector, said phase aligner systems coupled together such that the selected delayed version of signals generated by said designated standby clock system provided by one of said phase aligner systems is coupled to an input port of the following phase aligner system.

18. A phase aligner system in accordance with claim 17 wherein the delay caused by delay elements in said second phase aligner system is smaller than the delay caused by delay elements in said first phase aligner system.

* * * * *